US010235959B2

(12) United States Patent
Abe et al.

(10) Patent No.: US 10,235,959 B2
(45) Date of Patent: *Mar. 19, 2019

(54) DRIVER CIRCUIT

(71) Applicant: Japan Display Inc., Tokyo (JP)

(72) Inventors: Hiroyuki Abe, Tokyo (JP); Takayuki Suzuki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/946,991

(22) Filed: Apr. 6, 2018

(65) Prior Publication Data

US 2018/0226043 A1    Aug. 9, 2018

Related U.S. Application Data

(63) Continuation of application No. 15/097,414, filed on Apr. 13, 2016, now Pat. No. 9,972,268, which is a continuation of application No. 14/094,962, filed on Dec. 3, 2013, now Pat. No. 9,336,735.

(30) Foreign Application Priority Data

Dec. 5, 2012   (JP) .................................. 2012-266668

(51) Int. Cl.
  *G09G 3/36*      (2006.01)
  *G11C 19/28*     (2006.01)
(52) U.S. Cl.
  CPC .......... *G09G 3/3677* (2013.01); *G11C 19/28* (2013.01); *G09G 2300/0434* (2013.01); *G09G 2310/0283* (2013.01); *G09G 2310/0286* (2013.01); *G09G 2310/08* (2013.01)

(58) Field of Classification Search
  CPC ......... G09G 3/3677; G09G 2310/0286; G09G 2310/08; G09G 2310/0283
  See application file for complete search history.

(56) References Cited

U.S. PATENT DOCUMENTS

| 2002/0140650 | A1 | 10/2002 | Kai et al. |
| 2002/0186196 | A1 | 12/2002 | Park |
| 2007/0274433 | A1 | 11/2007 | Tobita |
| 2009/0015744 | A1 | 1/2009 | Sekine |

(Continued)

FOREIGN PATENT DOCUMENTS

| CN | 101329851 A | 12/2008 |
| CN | 102214428 A | 10/2011 |
| JP | 2010-073301 A | 4/2010 |

OTHER PUBLICATIONS

Office Action dated Jul. 29, 2015 regarding a corresponding Chinese Patent Application No. 201310647788.0.

*Primary Examiner* — Alexander Eisen
*Assistant Examiner* — Kebede Teshome
(74) *Attorney, Agent, or Firm* — Typha IP LLC

(57) ABSTRACT

The plurality of stages of circuit blocks of a driver circuit in a display device include a first transistor and a second transistor. The first transistor is connected at its gate with a first node and controls conductivity between a scanning signal line and a first clock signal line applied with a first clock signal. The first node is at an active potential when at least any one signal of signals output from one stage in each of a forward direction and a reverse direction is at the active potential. The second transistor is connected at its gate with the first node and controls conductivity between the first clock signal line and an input signal line of another stage of circuit block.

9 Claims, 10 Drawing Sheets

(56) References Cited

U.S. PATENT DOCUMENTS

2010/0067646 A1 3/2010 Liu et al.
2011/0316831 A1 12/2011 Ochiai et al.
2012/0229444 A1 9/2012 Ochiai et al.
2012/0262441 A1 10/2012 Ochiai et al.

DRIVER CIRCUIT

CROSS-REFERENCE TO RELATED APPLICATIONS

This application is a continuation of U.S. patent application Ser. No. 15/097,414filed on Apr. 13, 2016, which is a continuation of U.S. patent application Ser. No. 14/094,962, filed on Dec. 3, 2013 (now U.S. Pat. No. 9,336,735). Further, this application claims priority from Japanese application JP2012-266668 filed on Dec. 5, 2012, the contents of which are hereby incorporated by reference into this application.

BACKGROUND OF THE INVENTION

1. Field of the Invention

The present invention relates to a display device.

2. Description of the Related Art

The liquid crystal display devices are widely used as flat panel display devices used in information communication terminals or television receivers. The liquid crystal display device is a device which changes an orientation of a liquid crystal composition confined between two substrates by changing an electric field, and controls the degree of transmission of light passing through the two substrates and the liquid crystal composition to thereby display an image. An organic EL display device (OLED), a field emission display device (FED), or the like has also been known as a flat panel display device.

In display devices, which includes the liquid crystal display device described above, that, a voltage corresponding to a predetermined gray scale value is applied to each of pixels in a screen, pixel transistors for applying the voltage are arranged in each of the pixels. In general, gates of the pixel transistors corresponding to one line of the screen are connected to one signal line (hereinafter referred to as scanning signal line ). The scanning signal line is controlled by a driver circuit so as to output in sequence an active voltage for rendering the pixel transistors conductive for each line. Moreover, some circuits have a bi-directional scanning function with which the active voltage can be output in sequence both in a forward direction and a reverse direction so that the screen can be displayed even in an inverted manner. JP 2010-073301 A discloses a circuit for realizing the bi-directional scanning.

SUMMARY OF THE INVENTION

In recent years, a reduction in picture-frame area that is an area around a display area is demanded. However, an increase in the scale of a circuit is a factor in preventing a reduction in the picture-frame area. In the related-art bi-directional scanning circuit, circuits are arranged on one side of the display area, and a signal output to a scanning signal line on a preceding stage is input as it is to be used as a trigger signal for outputting a signal. In such a bi-directional scanning circuit, the picture-frame area tends to be increased. Moreover, when there is an abnormality such as current leakage on the scanning signal line, the trigger signal to the next stage is not transmitted, involving a risk that subsequent screens are not normally displayed.

The invention has been made in view of the circumstances described above, and it is an object, of the invention to provide a display device that reduces a circuit scale while performing bi-directional scanning, and can perform, even when there is an abnormality on a scanning signal line, display of other areas.

A display device according to an aspect of the invention includes: a plurality of scanning signal lines disposed in a display area of a rectangle, arranged in parallel with one side of the rectangle, and applied with an active potential as a potential rendering a transistor conductive; and a driver circuit sequentially applying the active potential in selected one direction of a forward direction from one end of the plurality of scanning signal lines arranged in parallel and a reverse direction from the other end, wherein the driver circuit includes a plurality of stages of circuit blocks as circuits respectively applying the active potential to the plurality of scanning signal lines, portions of the plurality of stages of circuit blocks are arranged to a side of one side of the rectangular display area while the remaining portions are arranged to a side of the other side facing the one side, and at least one stage of circuit block of the plurality of stages of circuit blocks includes a first transistor whose gate is connected to a first node and which controls conductivity between the scanning signal line and a first clock signal line applied with a first clock signal, the first node being at the active potential when at least any one signal of signals output from one stage in each of the forward direction and the reverse direction is at the active potential, and a second transistor whose gate is connected to the first node and which controls conductivity between the first clock signal line and an input signal line of another stage of circuit block.

In the display device according to the aspect of the invention, the at least one stage of circuit block may include a third transistor whose gate is connected to a second node and which controls conductivity between the scanning signal line and a signal line applied with an inactive potential as a potential rendering a transistor non-conductive, the second node becoming at the active potential when a second clock signal whose active potential does not temporally overlap that of the first clock signal is at the active potential, and a fourth transistor whose gate is connected to the second node and which controls conductivity between a signal line applied with the inactive potential and the input signal line of the another stage of circuit block.

In the display device according to the aspect of the invention, the another stage of circuit block may be a circuit block on a stage outputting a signal to a second subsequent scanning signal line in the forward direction and the reverse direction.

In the display device according to the aspect, of the invention, at least one stage of circuit block of the plurality of stages of circuit blocks may further include an inspection terminal transistor whose gate is connected to the first node and which controls conductivity between the first clock signal line and the input signal line of the another stage.

In the display device according to the aspect of the invention, the first clock signal may be one clock signal of multiphase clock signals, at least one stage of circuit block may include a start signal transistor controlling conductivity between the first node and a start clock signal as one clock signal of the multiphase clock signals, the start clock signal becoming at the active potential immediately before the first clock signal is at, the active potential, and a start signal may be input to a gate of the start signal transistor, the start signal becoming at the active potential when the start clock signal is at an inactive potential and becoming at the inactive potential when the start, clock signal is then at, the active potential.

DETAILED DESCRIPTION OF THE INVENTION

Figure 1:
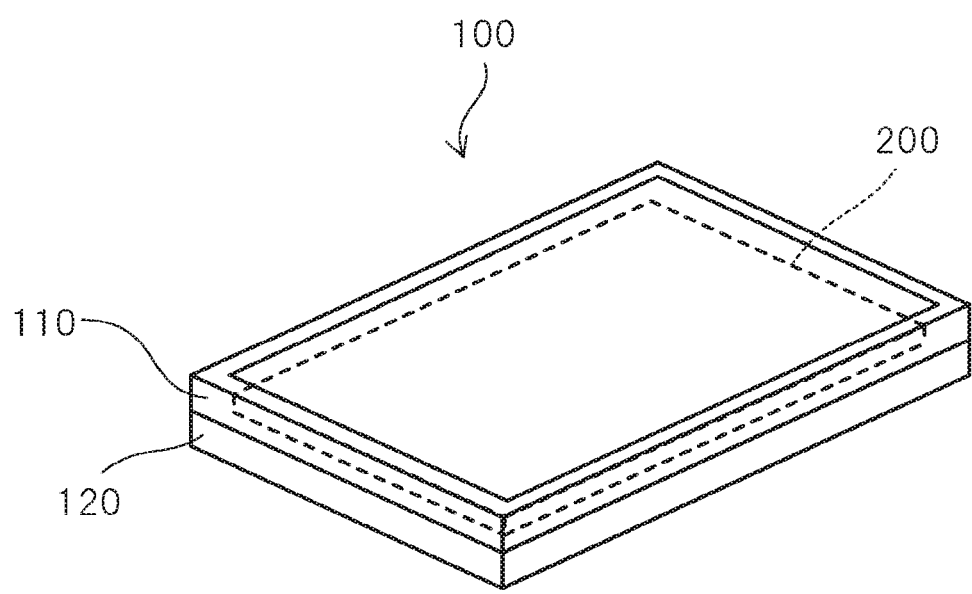
FIG. 1 schematically shows a liquid crystal display device as a display device according to an embodiment of the invention.

Hereinafter, an embodiment of the invention will be described with reference to the drawings. In the drawings, the same or equivalent elements are denoted by the same reference numeral and sign, and a redundant description is omitted.

FIG. 1 schematically shows a liquid crystal display device 100 as a display device according to the embodiment of the invention. As shown in the drawing, the liquid crystal display device 100 is composed of a liquid crystal panel 200 fixed by an upper frame 110 and a lower frame 120 so as to be interposed therebetween, a backlight device (not shown), and the like.

Figure 2:
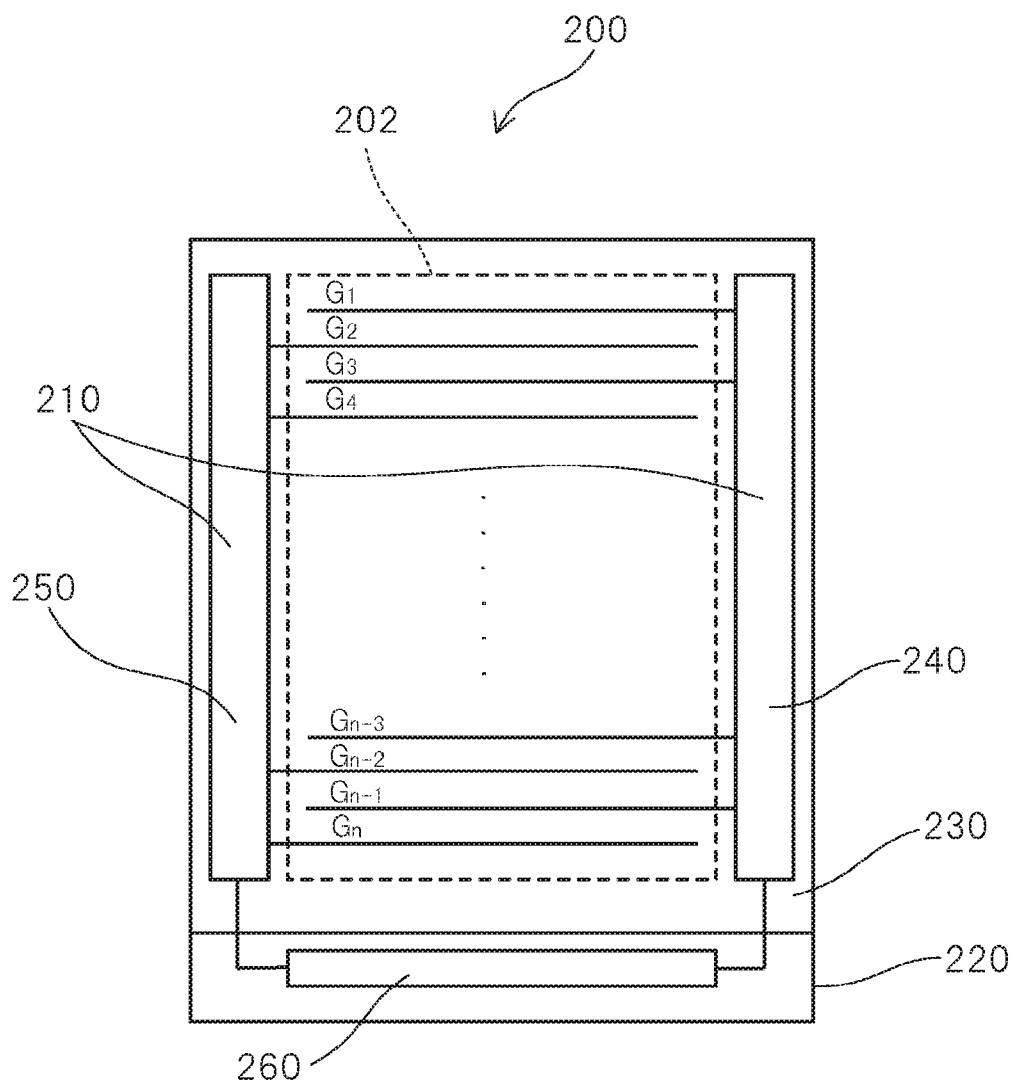
FIG. 2 shows the configuration of a liquid crystal panel in FIG. 1.

FIG. 2 shows the configuration of the liquid crystal panel 200 in FIG. 1. The liquid crystal panel 200 includes two substrates, that is, a TFT (Thin Film Transistor) substrate 220 and a color filter substrate 230. A liquid crystal composition is sealed between the substrates. The TFT substrate 220 includes a driver-circuit 210 and a driver IC (Integrated Circuit) 260. The driver circuit 210 applies a High potential (active potential) for establishing conductivity between the source and drain of a TFT in sequence to scanning signal lines G1 to Gn in selected one direction of a forward direction and a reverse direction. The driver IC 260 applies a voltage corresponding to a pixel gray scale value to a plurality of data signal lines (not shown) extending so as to perpendicularly intersect the scanning signal lines G1 to Gn in a pixel region 202, and controls the driver circuit 210. The driver circuit 210 includes a right driver circuit 240 located to the right of the pixel region 202 in the drawing and a left driver circuit 250 located to the left of the pixel region.

Figure 3:
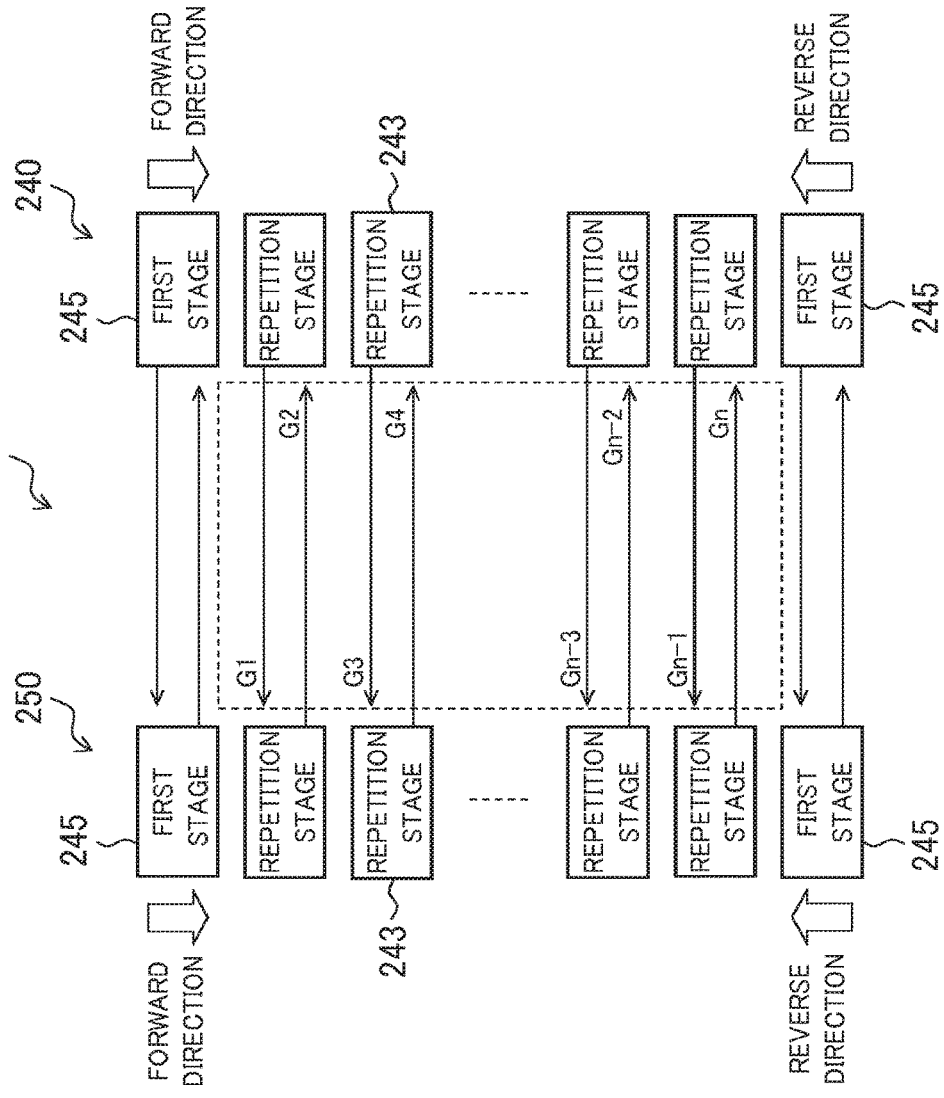
FIG. 3 explains circuit blocks of a right driver circuit and a left driver circuit in FIG. 2.

FIG. 3 explains circuit blocks of the right driver circuit 240 and the left driver circuit 250. As shown in the drawing, the right driver circuit 240 is composed of two first-stage circuit blocks 245 and repetition-stage circuit blocks 243. The two first-stage circuit blocks 245, which serve as circuit blocks of the start and end of scanning, apply the High potential to signal lines at both ends. The repetition-stage circuit blocks 243 apply the High potential for establishing conductivity between the source and drain of a TFT in sequence to odd-numbered scanning signal lines G1, G3, . . . , and Gn−1 between the first-stage circuit blocks 245. Similarly, the left driver circuit 250 is composed of two first-stage circuit blocks 245 and repetition-stage circuit blocks 243 that apply the High potential for establishing conductivity between the source and drain of a TFT in sequence to even-numbered scanning signal lines G2, G4, . . . , and Gn between the first-stage circuit blocks 245.

These stages operate alternately in the right driver circuit 240 and the left driver circuit 250, so that a predetermined voltage is applied in sequence to the scanning signal lines G1, G2, . . . , and Gn. In the case of forward scanning, the first-stage circuit block 245 at the upper right in FIG. 3 and the first-stage circuit block 245 at the upper left are started in sequence, so that the predetermined voltage is applied in sequence to the scanning signal lines G1, G2, . . . , and Gn. In the case of reverse scanning, the first-stage circuit block 245 at the lower left in FIG. 3 and the first-stage circuit block 245 at the lower right are started in sequence, so that the predetermined voltage is applied in sequence to the scanning signal lines Gn, Gn−1, . . . , and G1.

Each of the repetition-stage circuit blocks 243 of the right driver circuit 240 and the left driver circuit 250 operates using as a trigger an output from the next repetition-stage circuit block 243, that is, an output of the repetition-stage circuit block 243 that outputs a signal to a scanning signal line two lines away from the line of itself.

Figure 4:
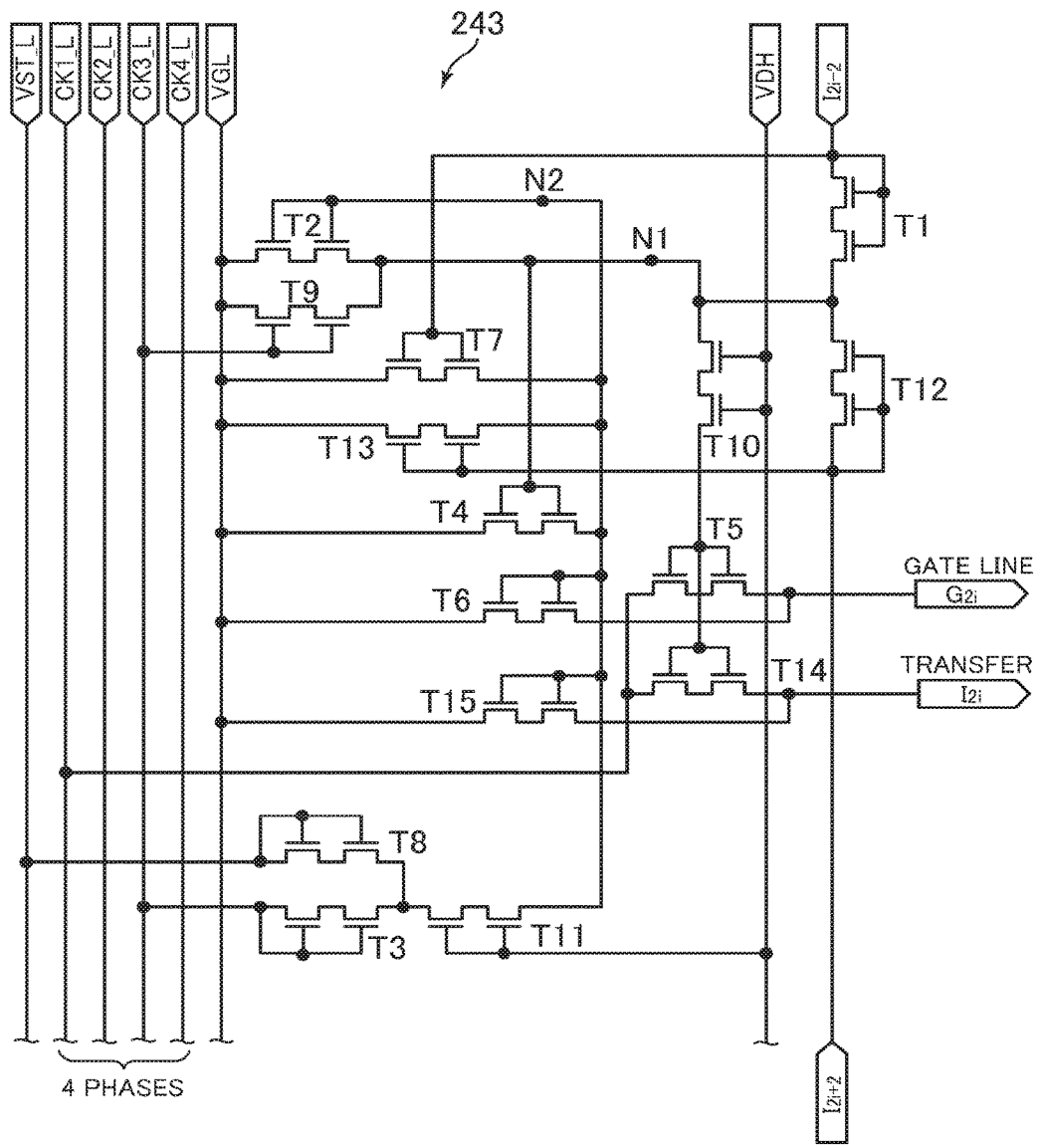
FIG. 4 specifically shows the circuit configuration of a circuit block of the left driver circuit in FIG. 3.

FIG. 4 specifically shows the circuit configuration of the repetition-stage circuit block 243 of the left driver circuit 250. As shown in FIG. 4, the repetition-stage circuit block 243 is a circuit that operates with two clock signals CK1_L and CK3_L and outputs the potential to a scanning signal line G2i. Reference sign T represents transistors, and reference sign N represents nodes. Each of the transistors is formed of LTPS (Low Temperature Poly Silicon).

As shown in the drawing, the circuit for outputting a signal to the scanning signal line G2i is composed of a diode transistor T1 serving as a circuit input at the time of forward scanning, a transistor T2 that fixes a gate electrode of a later-described transistor T5 at a voltage VGL, a transistor T3 that charges a holding node N2, a holding node resetting transistor T4, a transistor T5 for outputting the High potential to the gate line, a transistor T6 that fixes the gate line at VGL with the holding node N2, a transistor T7 that resets the holding node N2 with an input signal at the time of forward scanning, an initial resetting transistor T8, a transistor T9 for resetting the gate electrode of the transistor T5, a voltage relaxation transistor T10 that controls a voltage rise due to the transistor T5 with an intermediate voltage (VDH), a transistor T11 that steps down with the intermediate potential VDH the voltage charged by the transistor T3, a diode transistor T12 serving as a circuit input at the time of reverse scanning, a transistor T13 that resets the holding node N2 with an input signal at the time of reverse scanning, a transistor T14 for output ting a next-stage input, signal I2i at the same time as outputting to the gate line, and a transistor T15 that fixes the gate line at VGL with the holding node N2. Each of the transistors has a double-gate structure for higher withstand voltage in which two transistors are arranged in an overlapped manner so as to be capable of withstanding a voltage raised by a clock signal being at the High potential. The intermediate potential VDH renders the transistors conductive but is lower than a gate line High potential VGH.

Figure 5:
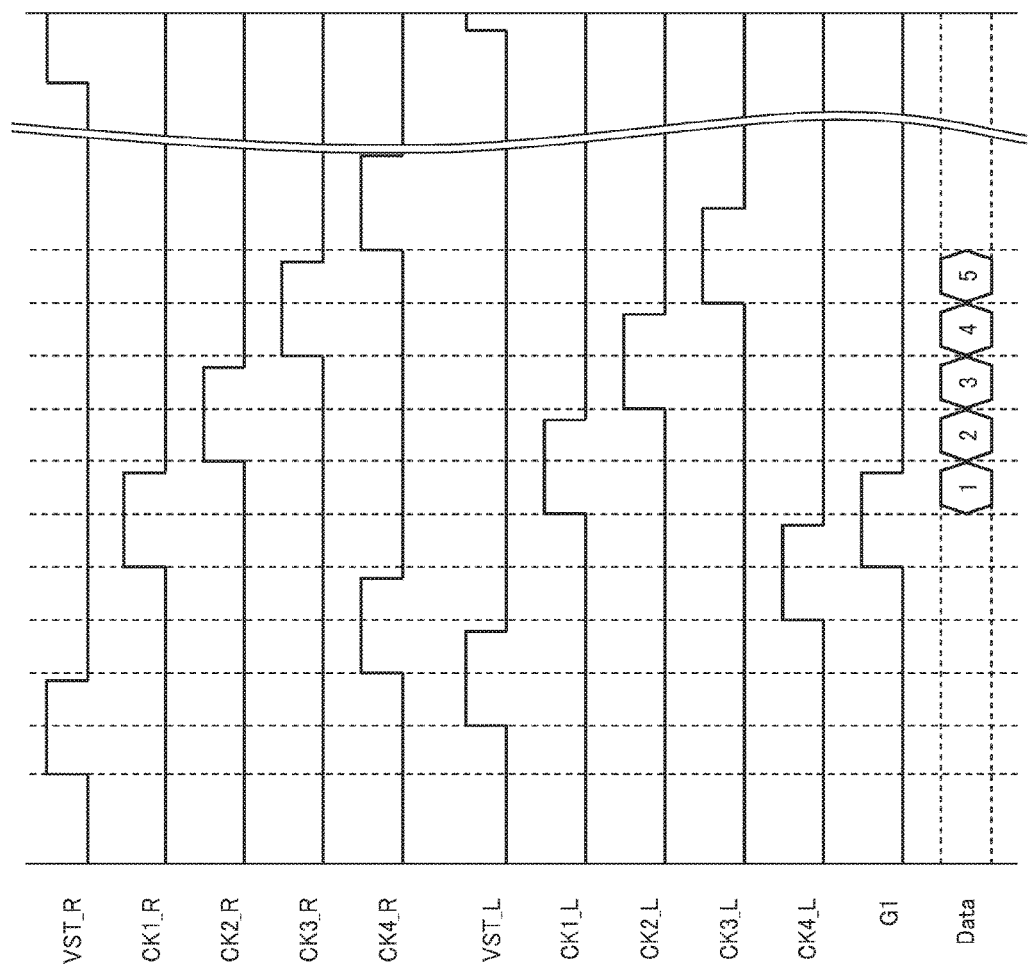
FIG. 5 is a timing diagram showing clock signals input to each of the right driver circuit and the left driver circuit at the time of forward scanning.

FIG. 5 is a timing diagram, showing clock signals and the like input to each of the right driver circuit 240 and the left driver circuit 250 at the time of forward scanning. Four-phase clock signals CK1_R, CK2_R, CK3_R, and CK4_R are input to the right driver circuit 240, while four-phase clock signals CK1_L, CK2_L, CK3_L, and CK4_L in different phase from the right driver circuit are input to the left driver circuit 250. Moreover, start signals VST_R and VST_L are also input at different timings. Although the signals at the time of forward scanning are shown in FIG. 5, the signals rise from CK4_R and CK4_L in reverse order from that shown in FIG. 5 at the time of reverse scanning.

Referring back to FIG. 4, the operation of the repetition-stage circuit block 243 when outputting to the scanning signal line G2$i$ will be next described. The repetition-stage circuit block 243 firsts receives, as a reset operation, the High potential of the start signal VST_L of the left driver circuit 250 to set the potential of the holding node N2 to High. Next, the High potential of a next-stage input signal I2$i$-2 is input, so that the transistor T7 is first rendered conductive and the node N2 is connected with a Low potential (VGL) to be at the Low potential. Also, the transistor T1 is rendered conductive, and the node N1 is at the High potential and remains thereat. Therefore, via the transistor T10 whose gate is applied with the intermediate potential VDH, the node N2 is at the High potential, and the transistor T5 is rendered conductive.

Subsequently, when the clock signal CK1_L is at the High potential, a High signal is output to the scanning signal line G2$i$. Thereafter, following the operation of the clock signal CK1_L, a Low signal is output to the scanning signal line G2$i$. Next, CK3_L goes High, so that T3 is rendered conductive, the node N2 goes High, and also, the transistor T9 is rendered conductive. Therefore, the node N1 goes Low. The transistor T6 is rendered conductive due to the High potential at N2, so that the scanning signal line C2$i$ is connected with the Low potential (VGL) and fixed at the Low potential. Although the operation of the repetition-stage circuit block 243 of the left driver circuit 250 has been described herein as an example, the same applies to the operation of the repetition-stage circuit block 243 of the right, driver circuit 240.

Figure 6:
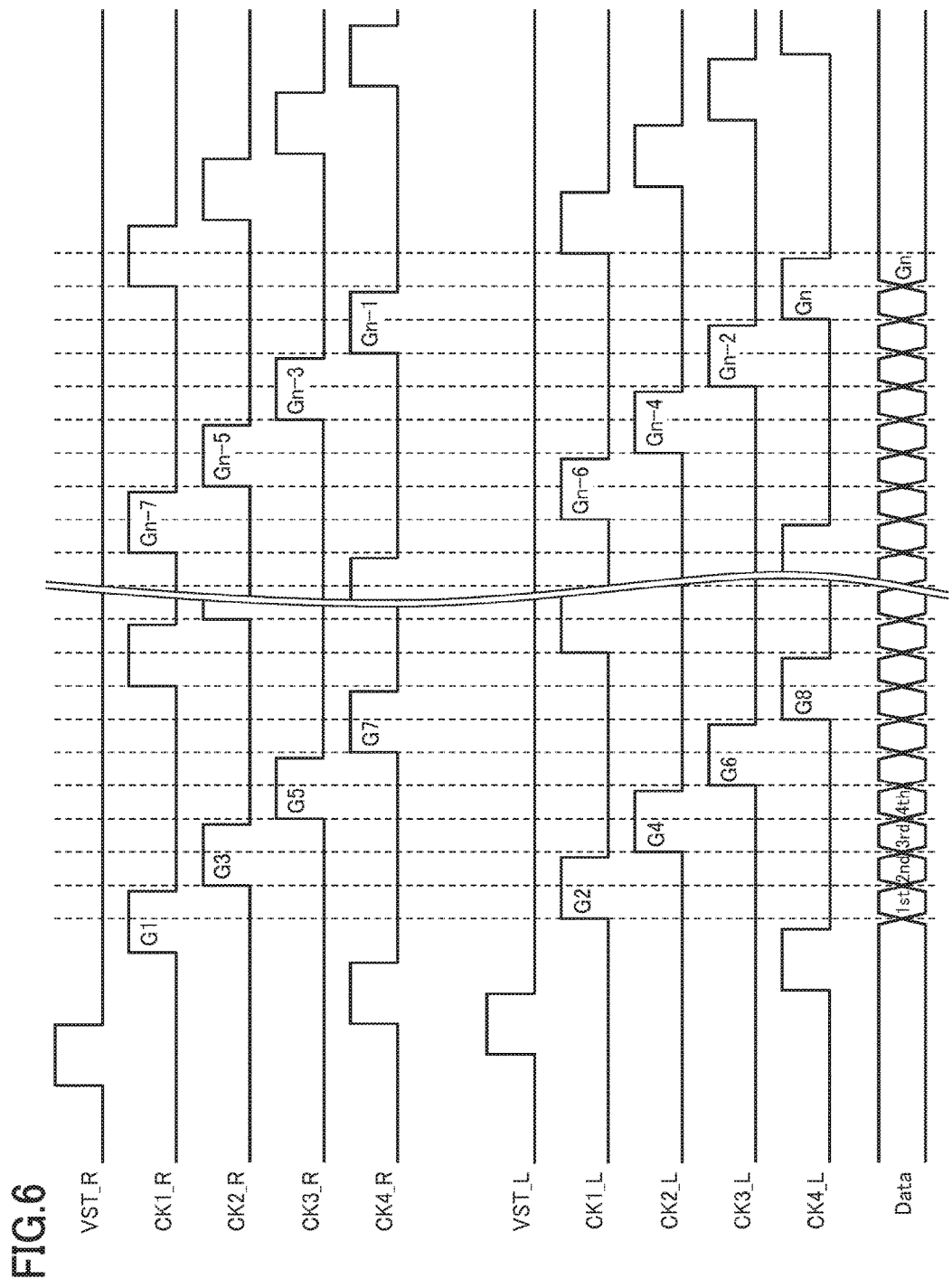
FIG. 6 is a timing diagram showing clock signals in forward scanning and gate signal lines to which the clock signals are directly output.

FIG. 6 is a timing diagram snowing clock signals in forward scanning and gate signal lines to which the High potential is output at the timing at which the clock signals are at the High potential. As shown in the drawing, the High potential is output from the right driver circuit 240 in sequence to the odd-numbered scanning signal lines G1, G3, . . . , and Gn−1. Then, at the timing between these outputs of the High potential, the High potential is output from the left driver circuit, 250 in sequence to the even-numbered scanning signal lines G2, G4, . . . , and Gn. A data signal is output to the data signal lines in synchronization with these outputs of the High potential.

Figure 7:
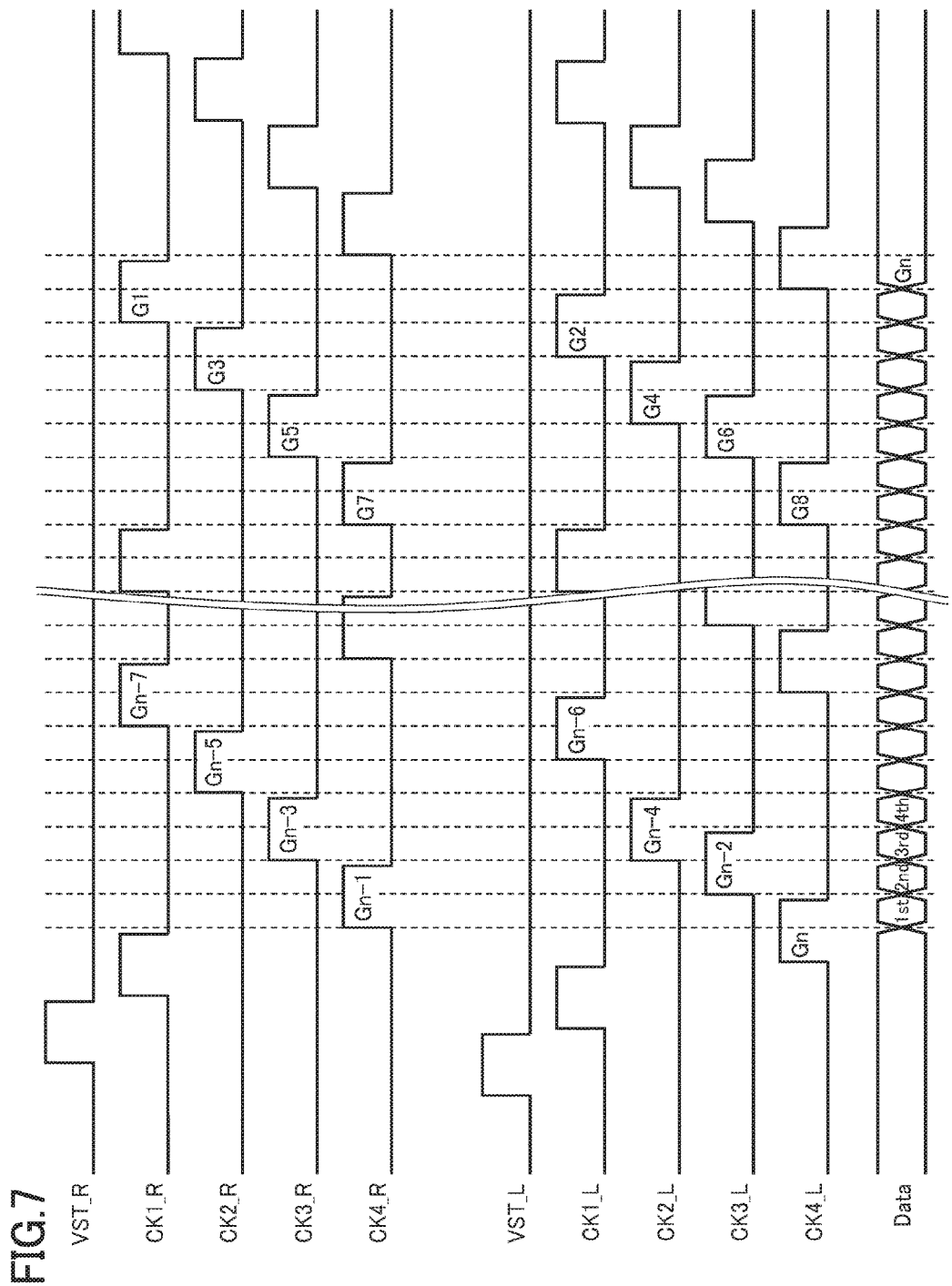
FIG. 7 is a timing diagram showing clock signals in reverse scanning and gate signal lines to which the clock signals are directly output.

FIG. 7 is a timing diagram showing clock signals in reverse scanning and gate signal lines to which the clock signals are directly output. As shown in the drawing, in reverse order from FIG. 6, the High potential is output, from the left driver circuit 250 in sequence to the even-numbered scanning signal lines Gn, G−2, . . . , and G2. Then, at the timing between these outputs of the High potential, the High potential is output from the right driver circuit 240 in sequence to the odd-numbered scanning signal lines Gn 1, Gn 3, . . . , and G1.

Figure 8:
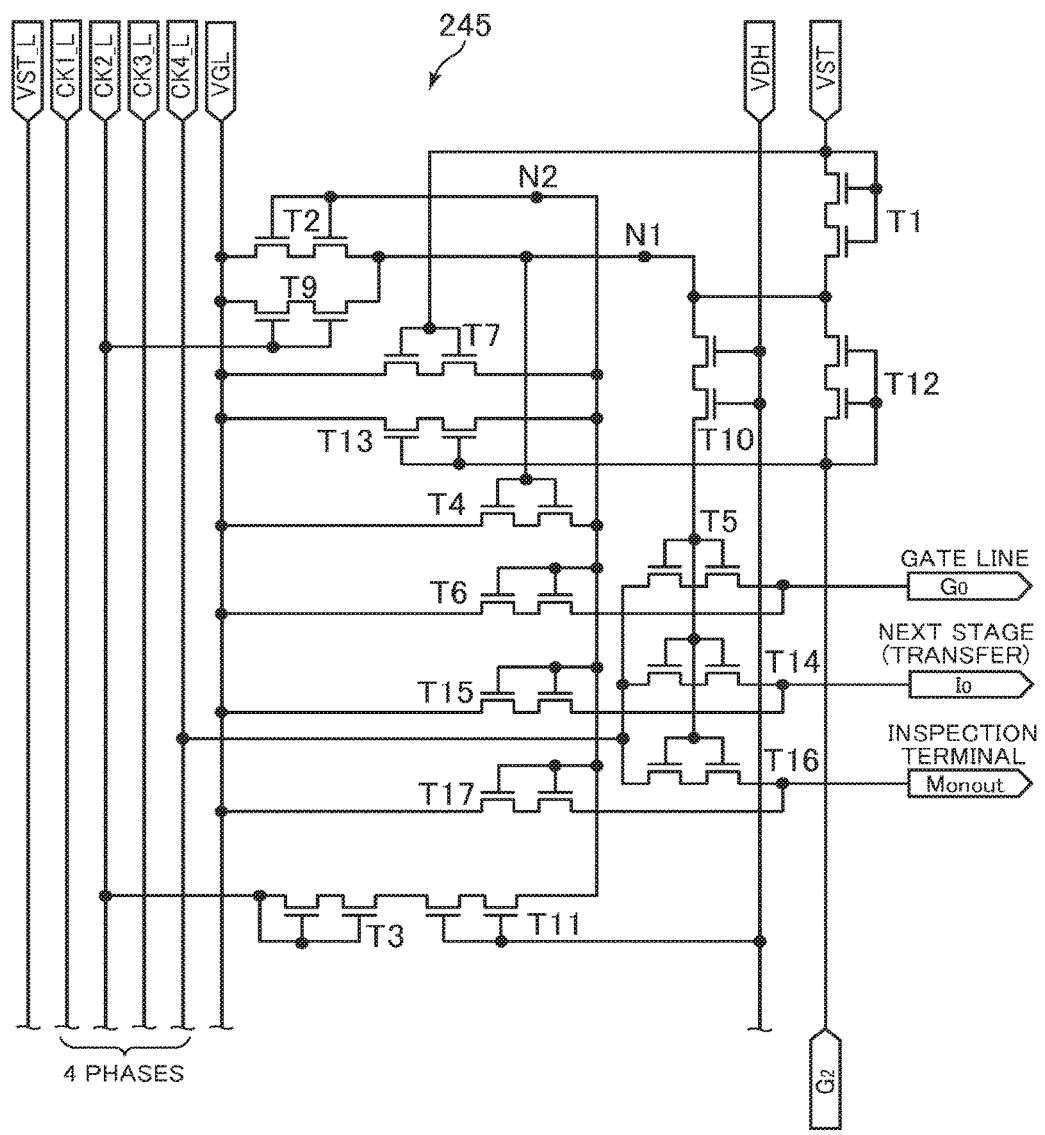
FIG. 8 is a circuit diagram of a first-stage circuit block as the first stage of the left, driver circuit.

FIG. 8 shows a circuit of the first-stage circuit block 245 as the first stage of the left, driver circuit 250. The first-stage circuit block 245 differs from the repetition-stage circuit block 243 in that a transistor T16 for outputting a signal to an inspection terminal at the same time as outputting to the gate line and a transistor T17 that fixes the inspection terminal at VGL with the holding node N2 are arranged, and that the initial resetting transistor T8 is not arranged. The operation of the first-stage circuit block 245 is almost similar to that of the repetition-stage circuit block 243, excepting that a trigger for starting the operation of the circuit is not a next-stage input signal of the circuit block input to a second preceding scanning signal line, but is the start, signal VST. Therefore, a description is omitted.

Although FIG. 8 shows the first-stage circuit block 245 as the first stage of the left driver circuit 250, the circuits of the final stage of the left driver circuit 250 and the first and final stages of the right driver circuit 240 are each composed of the same first-stage circuit block 245. In the embodiment, outputs of the right driver circuit 240 and the left driver circuit 250 are not input to each other, but clocks in different phases from each other with the same period are input in the right driver circuit 240 and the left driver circuit 250, so that the right driver circuit 240 and the left driver circuit 250 operate independently of each other.

With this configuration, since the circuits can be distributed on both sides of the display area while performing bi-directional scanning, the picture-frame area formed around the display area can be more reduced. Moreover, since the right driver circuit 240 and the left driver circuit 250 operate independently of each other, even when a trouble occurs in one of them, they can perform driving without affecting each other s driving. Further, each of the right driver circuit 240 and the left driver circuit 250 includes separately the transistor used for outputting the High signal to the scanning signal line and the transistor used for outputting the signal to be input to the next stage. Therefore, even when a potential is lowered due to leakage on the scanning signal line or the like, image output on and after the next stage is not affected, which can reduce a display trouble to minimum.

Next, with reference to FIGS. 9 to 12, a modified example of the embodiment described above will be described. In the embodiment described above, the first-stage circuit block 245 is disposed for each of the scanning signal lines at both ends, and the same start signal VST is input thereto. In this case, the High potential is output sequentially to the scanning signal lines from the first stage, and besides, the High potential is output to the scanning signal line in the first-stage circuit block 245 on the final stage.

Figure 9:
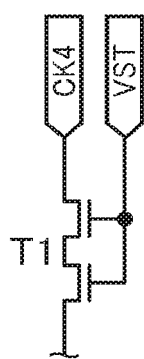
FIG. 9 shows an input circuit for starting outputting without using the first-stage circuit block.
Figure 10:
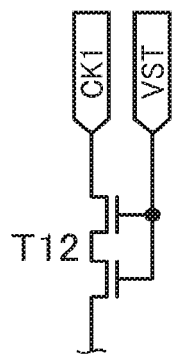
FIG. 10 shows an input circuit for starting outputting without using the first-stage circuit block.

FIGS. 9 and 10 each show an input circuit of the first-stage circuit block 245. FIG. 9 shows an input circuit for the repetition-stage circuit block 243 where the clock signal CK4 is used as an output of the first or last scanning signal line. FIG. 10 shows an input circuit for the repetition-stage circuit block 243 where the clock signal CK1 is used as an output of the last or first scanning signal line.

Figure 11:
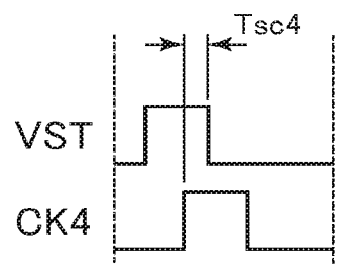
FIG. 11 is a timing diagram showing input signals to the input circuit in FIG. 9.

FIG. 11 is a timing diagram showing input signals to the circuit in FIG. 9. As shown in the drawing, the signals are input such that when the clock signal CK4 is at the Low potential as an inactive potential, the start signal VST rises, and that when the clock signal CK4 is then at the High potential, the start signal VST falls. With this configuration, in the circuit on the final stage to which the start signal VST is input, the High potential is prevented from, being output to a scanning signal line due to the operation of the circuit. It is also possible to output a signal to the repetition-stage circuit block 243 only by the circuit in FIG. 9 without using the first-stage circuit block 245, so that the number of circuits that output a dummy scanning signal can be reduced as a whole. Therefore, the circuit scale can be reduced, so that the picture-frame area can be reduced.

Figure 12:
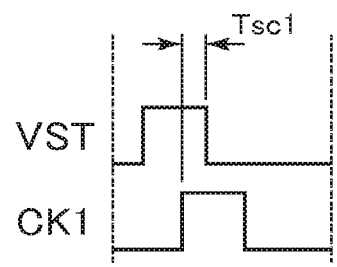
FIG. 12 is a timing diagram showing input signals to the input circuit in FIG. 10.

FIG. 12 is a timing diagram showing input signals to the circuit in FIG. 10. Also in this case, similarly to FIG. 11, the signals are input such that when the clock signal CK1 is at the Low potential, the start signal VST rises, and that when the clock signal CK4 is then at the High potential, the start signal VST falls. With this configuration, in the circuit on the final stage to which the start signal VST is input, the High potential is prevented from being output to a scanning signal line due to the operation of the circuit. It is also possible to output a signal to the repetition-stage circuit block 243 only by the circuit in FIG. 10 without using the first-stage circuit block 245, so that the number of circuits that output a dummy scanning signal can be reduced as a whole. Therefore, the circuit scale can be reduced, so that the picture-frame area can be reduced.

As has been described above, in the embodiment of the invention, the driver circuit that applies the potential to the odd-numbered scanning signal lines and the driver circuit that applies the potential to the even-numbered scanning signal lines are arranged so as to interpose the pixel region therebetween. Therefore, the circuit scale can be reduced to half of the scale when the circuit is arranged on one side of the pixel region, so that the picture-frame area of the display device can be reduced.

Moreover, the same circuit is used for scanning in the forward direction and for scanning in the reverse direction. Therefore, since a circuit for scanning in the reverse direction does not need to be arranged, the circuit scale can be reduced, so that the picture-frame area of the display device can be reduced.

Moreover, the transistors each have a double-gate structure in which transistors are arranged in an overlapped manner. Therefore, even with LTPS transistors, a circuit of high withstand voltage can be formed.

Moreover, since the right driver circuit and the left driver circuit operate independently of each other, even when a trouble occurs in one of them, they can perform driving without affecting each other s driving. Further, each of the right, driver circuit and the left driver circuit includes separately the transistor used for outputting the High signal to the scanning signal line and the transistor used for outputting the signal to be input, to the next, stage. Therefore, even when a potential is lowered due to leakage on the scanning signal line or the like, image output on the next and subsequent stages is not affected, which can reduce a display trouble to minimum.

Although, in the embodiment described above, four kinds of four-phase clocks are used as clock signals, two or more kinds of multiphase clock signals, other than the four kinds, may be used.

Moreover, the liquid crystal display device of the embodiment described above can be applied to any liquid crystal display devices of IPS (In-Plane Switching) type, VA (Vertically Aligned) type, and TN (Twisted Nematic) type. Moreover, the invention is not limited to a liquid crystal display device, and can be used for other display devices, such as an organic EL display device, using a driver circuit.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A driver circuit comprising:
a plurality of stages of circuit blocks as circuits respectively outputting an active potential to an output electrode; and
a clock signal line applying a clock signal to the plurality of stages,
wherein
the clock signal includes the active potential,
at least one stage of circuit block of the plurality of stages of circuit blocks includes a first transistor, a second transistor, a third transistor, a first node, a second node, and a transfer electrode,
the active potential can turn on the first transistor,
the first transistor connects the clock signal line and the output electrode, and applies the active potential of the clock signal to the output electrode; when the first transistor is an ON state,
the second transistor connects the clock signal line and the transfer electrode; which is electrically connected to the first node of a next stage of the plurality of stages, and applies the active potential of the clock signal to the first node of the next stage when the second transistor is an ON state,
the first node is connected to a gate of the first transistor of a present stage and to a gate of the second transistor of the present stage,
the third transistor connects the output signal line and a constant voltage line when the third transistor is an ON state,
the second node is connected to a gate of the third transistor of the present stage, and
the transfer electrode is not directly connected to the output electrode.

2. The driver circuit according to claim 1 further comprising
a fourth transistor, wherein
the fourth transistor connects the constant voltage line and the first node of the next stage.

3. The driver circuit according to claim 1 further comprising
a fifth transistor, wherein
the fifth transistor connects the first node and the gate of the first transistor,
the fifth transistor has a gate which is connected to an active potential line which supplies the active potential, and
the fifth transistor has a double-gate structure.

4. The driver circuit according to claim 1, wherein
the second transistor connects the clock signal line and the first node of a previous stage of the plurality of stages, and applies the active potential of the first clock signal to the first node of the previous stage when the second transistor is an ON state.

5. The driver circuit according to claim 1, wherein
the fourth transistor connects the constant voltage line and the first node of a previous stage when the fourth transistor is an ON state.

6. A driver circuit comprising:
a plurality of stages of circuit blocks as circuits respectively applying an active potential to an output electrode,
a pulse signal line applying a pulse signal to the plurality of stages,
an active signal line applying the active potential, and
an inactive signal line applying an inactive potential,
wherein
at least one stage of circuit block of the plurality of stages of circuit blocks includes a first transistor, a second transistor, a third transistor, a fourth transistor, a first node, a second node, a forward input terminal, a reverse input terminal, and a transfer electrode, the pulse signal includes the active potential which can turn on the first transistor and the inactive potential which can turn off the first transistor, the first transistor connects the pulse signal line and the output electrode, and applies the active potential of the pulse signal to the output electrode when the first transistor is an ON state, the first node is connected to a gate of the first transistor of a present stage, the second transistor connects the pulse signal line and the transfer electrode of the present, stage and applies the active potential of the pulse signal to the transfer electrode when the second transistor is an ON state, the forward input terminal of the present stage is directly connected to the transfer electrode of a previous stage, the reverse input terminal of the present stage is directly connected to the transfer electrode of the next stage, the third transistor connects the output electrode and the inactive signal line when the third transistor is an ON state, the second node is connected to a gate of the third transistor, the fifth transistor connects the first node and the gate of the first transistor, the fifth transistor has a gate which is connected to the active signal line, and the transfer electrode is not directly connected to the output electrode.

7. The driver circuit according to claim 6, wherein the fifth transistor has a double-gate structure.

8. The driver circuit according to claim 6, wherein the second transistor has a double-gate structure.

9. The driver circuit according to claim 6, wherein the fourth transistor has a double-gate structure.

* * * * *